(12) United States Patent
Tseng et al.

(10) Patent No.: US 11,049,771 B2
(45) Date of Patent: Jun. 29, 2021

(54) SEMICONDUCTOR DEVICE AND FINGERPRINT IDENTIFICATION DEVICE

(71) Applicant: Vanguard International Semiconductor Corporation, Hsinchu (TW)

(72) Inventors: Han-Liang Tseng, Hsinchu (TW); Hsin-Hui Lee, Kaohsiung (TW); Hsueh-Jung Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/136,792

(22) Filed: Sep. 20, 2018

(65) Prior Publication Data

US 2019/0304837 A1 Oct. 3, 2019

(30) Foreign Application Priority Data

Mar. 28, 2018 (TW) .................................. 107110689

(51) Int. Cl.
*H01L 21/77* (2017.01)
*H01L 27/146* (2006.01)
(Continued)

(52) U.S. Cl.
CPC .............. *H01L 21/77* (2013.01); *B41M 1/12* (2013.01); *B41N 1/24* (2013.01); *G02B 5/20* (2013.01); *G02B 27/30* (2013.01); *H01L 21/02002* (2013.01); *H01L 27/14601* (2013.01); *H01L 27/14625* (2013.01); *H01L 27/14678* (2013.01)

(58) Field of Classification Search
CPC ............. H01L 27/146; H01L 27/14601; H01L 27/14678; H01L 27/14605; H01L 31/02162; H01L 31/02165; H01L 27/1462; H01L 27/14623; H01L 27/14625; H01L 27/14683; H01L 27/14685; H01L 27/14603; H01L 27/14621–14625; G02B 27/30
See application file for complete search history.

(56) References Cited

U.S. PATENT DOCUMENTS 10,049,256 B2 * 8/2018 Wu ..................... G06K 9/0004
2004/0097006 A1 5/2004 Lowery
(Continued)

OTHER PUBLICATIONS

Search Report and Notice of Allowance dated Jan. 11, 2019 for Taiwanese Patent Application No. 107110689.

*Primary Examiner* — Sonya McCall-Shepard
(74) *Attorney, Agent, or Firm* — Birch, Stewart, Kolasch & Birch LLP

(57) ABSTRACT

A method for forming a semiconductor device is provided. The method includes providing a substrate, placing a first stencil having a first openwork pattern on the substrate, applying a first material onto the substrate through the first stencil, and removing the first stencil from the substrate. The first material includes a transparent material. The method also includes placing a second stencil having a second openwork pattern on the substrate, applying a second material onto the substrate through the second stencil, and removing the second stencil from the substrate. The second material includes a light-shielding material, and the second openwork pattern is different from the first openwork pattern.

10 Claims, 13 Drawing Sheets

(51) Int. Cl.
 *G02B 27/30* (2006.01)
 *G02B 5/20* (2006.01)
 *H01L 21/02* (2006.01)
 *B41M 1/12* (2006.01)
 *B41C 1/14* (2006.01)
 *B41N 1/24* (2006.01)

(56) References Cited

U.S. PATENT DOCUMENTS

| | | |
|---|---|---|
| 2008/0238294 A1 | 10/2008 | Xu et al. |
| 2017/0205666 A1* | 7/2017 | Suh .................... G02F 1/133504 |
| 2017/0220844 A1* | 8/2017 | Jones ................... G06K 9/0053 |
| 2019/0065816 A1* | 2/2019 | Reinhold ............... G06K 9/209 |
| 2019/0096364 A1* | 3/2019 | Lyngnes ................ G09G 5/10 |
| 2019/0179488 A1* | 6/2019 | Klenkler ............... G06K 9/0004 |
| 2020/0058888 A1* | 2/2020 | Sugiyama ................ G09F 9/30 |

* cited by examiner

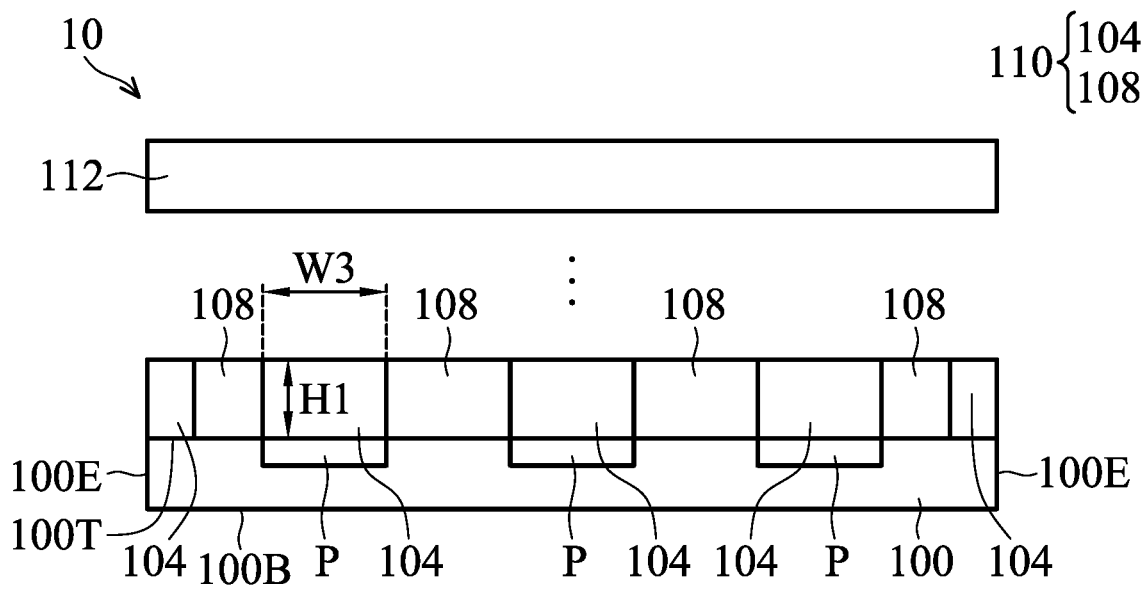
FIG. 1H'
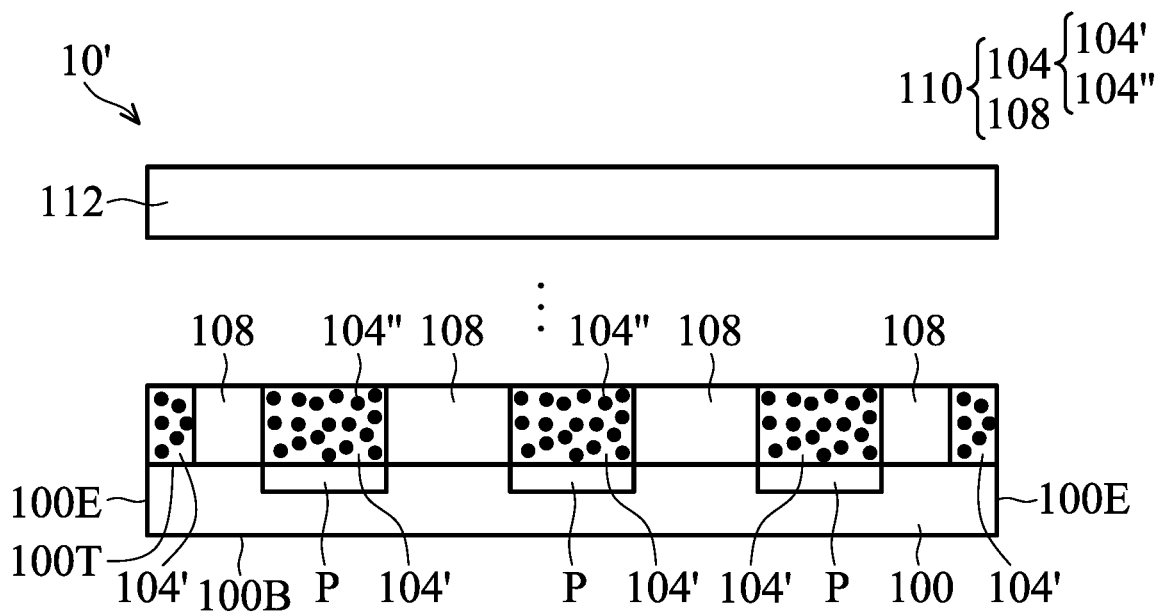
FIG. 1H"

ced on Mar. 28, 2018, the entirety of
SEMICONDUCTOR DEVICE AND FINGERPRINT IDENTIFICATION DEVICE

CROSS REFERENCE TO RELATED APPLICATIONS

This application claims priority of Taiwan Patent Application No. 107110689 filed on Mar. 28, 2018, the entirety of which are incorporated by reference herein.

BACKGROUND

Embodiments of the present disclosure relate to a method for forming a semiconductor device, and in particular they relate to a method for forming a semiconductor device that includes a transparent material and a light-shielding material.

Semiconductor devices are used in a variety of electronic applications. For example, semiconductor devices may serve as a fingerprint identification device (or at least a portion of a fingerprint identification device). A fingerprint identification device may be made of lots of optical elements. For example, the optical elements may include a light collimator, a beam splitter, a focusing lens, and a linear sensor.

The function of the light collimator is to collimate the light, so as to reduce the energy loss caused by light scattering. For example, the light collimator may be used in a fingerprint identification device to improve the performance of the fingerprint identification device.

However, existing light collimators and the methods of forming them are not satisfactory in every respect.

SUMMARY

Some embodiments of the present disclosure relate to a method for forming a semiconductor device. The method includes providing a substrate, and placing a first stencil on the substrate. The first stencil has a first openwork pattern. The method also includes applying a first material onto the substrate through the first stencil. The first material includes a transparent material. The method also includes removing the first stencil from the substrate, and placing a second stencil on the substrate. The second stencil has a second openwork pattern, and the first openwork pattern is different from the second openwork pattern. The method also includes applying a second material onto the substrate through the second stencil. The second material includes a light-shielding material. The method also includes removing the second stencil from the substrate.

Some embodiments of the present disclosure relate to a method for forming a semiconductor device. The method includes providing a substrate, and placing a first stencil on the substrate. The first stencil has a first openwork pattern. The method also includes applying a first material onto the substrate through the first stencil. The first material includes a transparent photoresist. The method also includes removing the first stencil from the substrate, performing a lithography process to pattern the first material to form a plurality of openings in the first material, and filling the openings with a second material. The second material includes a light-shielding material.

Some embodiments of the present disclosure relate to a semiconductor device. The semiconductor device includes a substrate, and a light collimator layer disposed on the substrate. The light collimator layer includes a transparent material, a light-shielding material, and a plurality of light filtering particles disposed in the transparent material. The light filtering particles are made of a light filtering material.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B' illustrates a top view of a stencil 102, in accordance with some embodiments of the present disclosure.

FIG. 1E' illustrates a top view of a stencil 106, in accordance with some embodiments of the present disclosure.

FIG. 1H' illustrates a cross-sectional view of a semiconductor device 10, in accordance with some embodiments of the present disclosure.

FIG. 1H" illustrates a cross-sectional view of a semiconductor device 10', in accordance with some embodiments of the present disclosure.

FIG. 2H' illustrates a cross-sectional view of a semiconductor device 20, in accordance with some embodiments of the present disclosure.

DETAILED DESCRIPTION

Figure 1A:
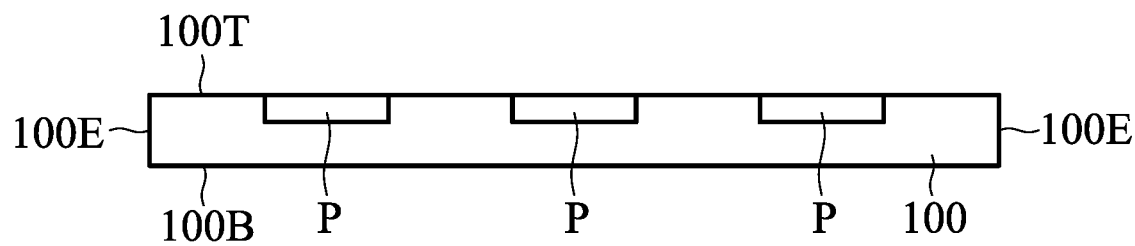
FIGS. 1A, 1B, 1C, 1D, 1E, 1F, 1G, and 1H are a series of cross-sectional views illustrating a method for forming a semiconductor device, in accordance with some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

It should be understood that additional steps can be implemented before, during, or after the illustrated methods, and some steps might be replaced or omitted in other embodiments of the illustrated methods.

Unless otherwise defined, all terms (including technical and scientific terms) used herein have the same meanings as commonly understood by one of ordinary skill in the art to which the present disclosure pertains. It should be understood that these terms, such as those defined in commonly used dictionaries, should be interpreted as having meanings consistent with the relevant art and the background or context of the present disclosure, and should not be interpreted in an idealized or overly formal manner, unless specifically defined in the embodiments of the present disclosure.

Embodiment 1

The method for forming the semiconductor device of Embodiment 1 uses a stencil printing process to dispose a transparent material and a light-shielding material on a substrate. The transparent material and the light-shielding material may serve as a light collimator layer of the semiconductor device (e.g., a fingerprint identification device). Since the costs of the stencil printing process are low, the costs of the light collimator layer and the semiconductor device including the light collimator layer may be reduced.

FIG. 1A illustrates the initial step of the method for forming the semiconductor device of the present embodiment. As shown in FIG. 1A, a substrate 100 is provided. The substrate 100 may have a top surface 100T and a bottom surface 100B opposite to the top surface 100T, and a side (or edge) 100E of the substrate 100 is between the top surface 100T and the bottom surface 100B.

In some embodiments, the substrate 100 may be made of an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof. In some embodiments, the substrate 100 may be a semiconductor-on-insulator (SOI) substrate. The semiconductor-on-insulator substrate may include a bottom substrate, a buried oxide layer disposed on the bottom substrate, and a semiconductor layer disposed on the buried oxide layer. In some embodiments, the substrate 100 may be a semiconductor wafer (e.g., a silicon wafer, or any other applicable semiconductor wafer).

In some embodiments, the substrate 100 may include various p-type doped regions and/or n-type doped regions formed by a process such as an ion implantation process and/or a diffusion process. For example, the doped regions may be configured to form a transistor, a photodiode, and/or a light-emitting diode, but the present disclosure is not limited thereto.

In some embodiments, the substrate 100 may include various isolation features to separate various device regions in the substrate 100. For example, the isolation features may include a shallow trench isolation (STI) feature, but the present disclosure is not limited thereto. In some embodiments, the formation of a STI feature may include etching a trench in the substrate 100 and filling in the trench with insulator materials (e.g., silicon oxide, silicon nitride, or silicon oxynitride). The filled trench may have a multi-layer structure such as a thermal oxide liner layer with silicon nitride filling the trench. A chemical mechanical polishing (CMP) process may be performed to polish back excessive insulator materials and planarize the top surface of the isolation features.

In some embodiments, the substrate 100 may include various conductive features (e.g., lines or vias). For example, the conductive features may be made of aluminum (Al), copper (Cu), tungsten (W), an alloy thereof, any other applicable conductive material, or a combination thereof.

Still referring to FIG. 1A, in some embodiments, the substrate 100 may include a plurality of pixels P. In some embodiments, the pixels P may receive the light signals and convert the light signals into electric current signals. In some embodiments, the pixels P of the substrate 100 may be arranged in an array, but the present disclosure is not limited thereto. For example, in some embodiments, each of the pixels P of the substrate 100 may include or correspond to at least one photodiode and/or other applicable elements, but the present disclosure is not limited thereto.

Figure 1B:
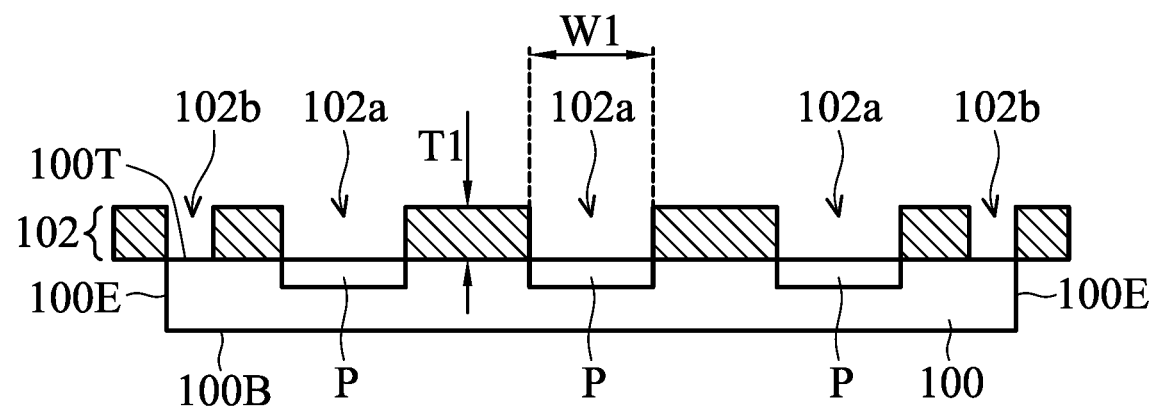
Figure 1B:
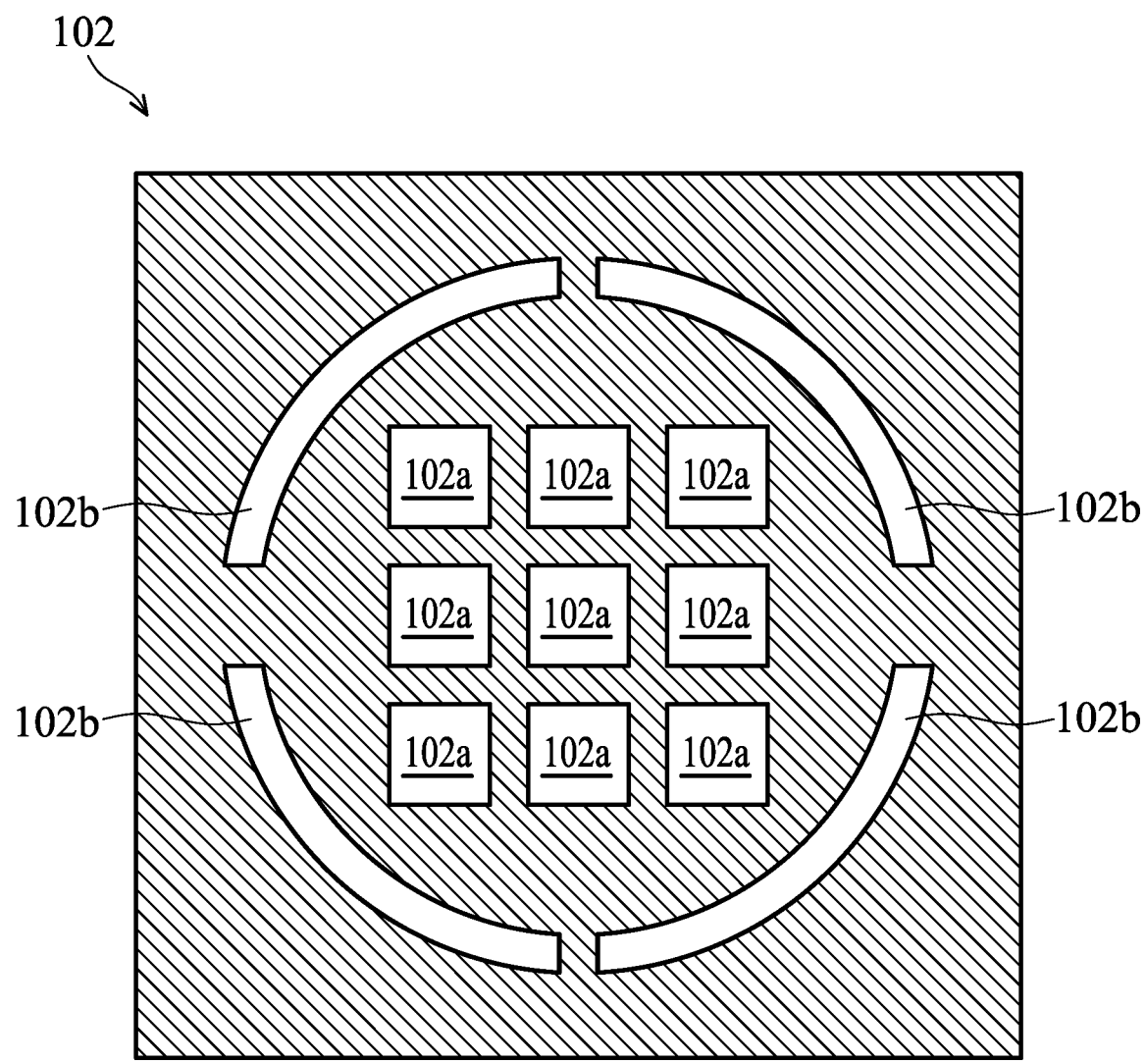

Then, as shown in FIG. 1B, a stencil 102 is placed on the top surface 100T of the substrate 100. In some embodiments, the stencil 102 may have a plurality of openings 102a corresponding to the pixels P of the substrate 100. In other words, in these embodiments, after the stencil 102 is placed on the top surface 100T of the substrate 100, each of the openings 102a may expose at least a portion of the corresponding pixel P. In some embodiments, the stencil 102 may also have openings 102b corresponding to the edges of the substrate 100. In other words, in these embodiments, after the stencil 102 is placed on the top surface 100T of the substrate 100, the openings 102b may expose the edges of the top surface 100T of the substrate 100. In some embodiments, the openings 102b may surround or encircle the openings 102a.

It should be understood that although the stencil 102 of the embodiments illustrated in FIG. 1B has the openings 102a corresponding to the pixels P of the substrate 100 and the openings 102b corresponding to the edges of the substrate 100, the present disclosure is not limited thereto. In some embodiments, the stencil 102 may have the openings 102a corresponding to the pixels P of the substrate 100 but no openings 102b corresponding to the edges of the substrate 100.

As shown in FIG. 1B, the stencil 102 may have a thickness T1, and the opening 102a may have a width W1. For example, the thickness T1 may be between 5 μm and 500 μm, but the present disclosure is not limited thereto. For example, the width W1 may be between 5 μm and 100 μm, but the present disclosure is not limited thereto.

FIG. 1B' illustrates a top view of the stencil 102. In some embodiments, as shown in FIG. 1B', the openings 102a and/or the openings 102b of the stencil 102 form an openwork pattern in the stencil 102. In subsequent steps, a material (e.g., transparent material) may be disposed on the top surface 100T of the substrate 100 through the openwork pattern of the stencil 102, so that the material disposed on the top surface 100T of the substrate 100 may have a pattern that corresponds to the openwork pattern of the stencil 102. The details are discussed in the following paragraphs.

In some embodiments, the ratio of the thickness T1 to the width W1 (i.e., T1/W1) is greater than 20, and thus the material disposed on the top surface 100T of the substrate 100 through the openwork pattern of the stencil 102 may easily collapse. Therefore, in some other embodiments, the ratio of the thickness T1 to the width W1 is less than or equal to 20 (e.g., the ratio of the thickness T1 to the width W1 is between 2 and 20), and thus the occurrence of the collapse of the material disposed on the top surface 100T of the substrate 100 through the openwork pattern of the stencil 102 may be reduced.

In some embodiments, since the pixels P of the substrate 100 are arranged in an array, the openings 102a corresponding to the pixels P are also arranged in an array. It should be understood that although the openings 102a are arranged in a 3×3 array in the embodiments illustrated in FIG. 1B', the present disclosure is not limited thereto. In some other embodiments, the array of the openings 102a may have any other applicable number of columns and any other applicable number of rows to meet the design requirements.

In some embodiments, as shown in FIG. 1B', the openings 102a may be substantially rectangular, but the present disclosure is not limited thereto. In some other embodiments, the openings 102a may be round, oval, oblong, hexagonal, irregular-shaped, another applicable shape, or a combination thereof to meet the design requirements.

For example, the stencil 102 may be made of steel, but the present disclosure is not limited thereto. For example, the openings 102a and/or 102b may be formed in the stencil 102 by a mechanical drilling process, but the present disclosure is not limited thereto.

Figure 1C:
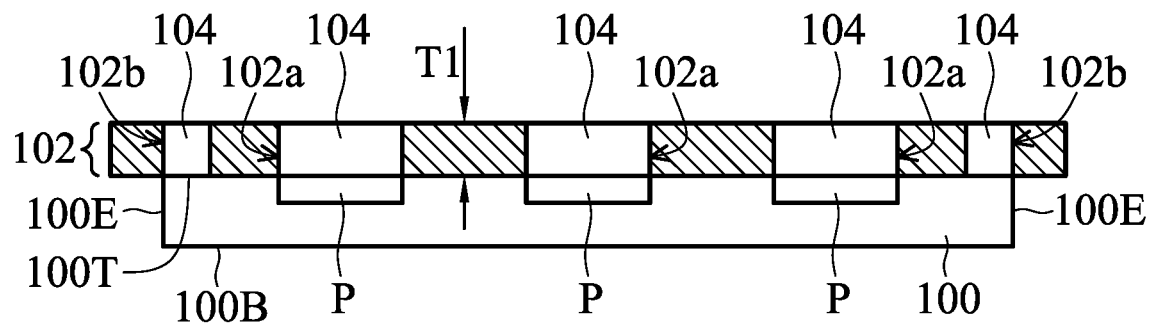

Then, as shown in FIG. 1C, in some embodiments, a first material 104 is disposed on the top surface 100T of the substrate 100 through the stencil 102. As shown in FIG. 1C, the openings 102a and/or 102b may be filled with the first material 104. In some embodiments, the first material 104 in the first openings 102a may cover the pixels P of the substrate 100, and the first material 104 in the second openings 102b may cover the edges of the top surface 100T of the substrate 100. As discussed above, since the first material 104 is disposed on the top surface 100T of the substrate 100 through the openwork pattern of the stencil 102, the first material 104 disposed on the top surface 100T of the substrate 100 may have a pattern that corresponds to the openwork pattern of the stencil 102. In some embodiments, the pattern of the first material 104 disposed on the top surface 100T of the substrate 100 may be substantially the same as the openwork pattern of the stencil 102.

In some embodiments, the first material 104 may include a transparent material (e.g., transparent photoresist, polyimide, epoxy, any other applicable material, or a combination thereof). In some embodiments, the first material 104 may include a light curing material, a thermal curing material, or a combination thereof. In some embodiments, the flowability of the first material 104 may be the same as or similar to gel or glue.

In some embodiments, the stencil 102 may be used to perform a stencil printing process to coat (or print) the first material 104 onto the top surface 100T of the substrate 100. In some embodiments, in the stencil printing process, the first material 104 is disposed on the stencil 102, and then a squeegee or a roller (not shown in the figures) may be moved on the top surface of the stencil 102 along a direction that is parallel with the top surface 100T of the substrate 100. The squeegee or the roller may provide an applicable pressure on the first material 104, so that the first material 104 is squeezed into the openings 102a and/or 102b from the top surface of the stencil 102.

Figure 1D:
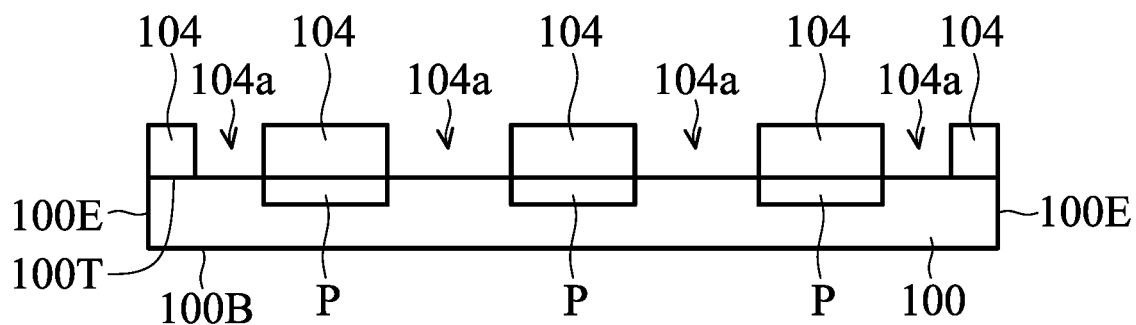

Then, as shown in FIG. 1D, the stencil 102 is removed from the top surface 100T of the substrate 100. In some embodiments, as shown in FIG. 1D, after the stencil 102 is removed from the top surface 100T of the substrate 100, a plurality of openings 104a are formed in the first material 104. In some embodiments, the openings 104a expose the top surface 100T of the substrate 100. In some embodiments, a curing process may be performed to cure the first material 104 after the stencil 102 is removed from the top surface 100T of the substrate 100. For example, the curing process may be a light curing process, a thermal curing process, or a combination thereof.

Figure 1E:
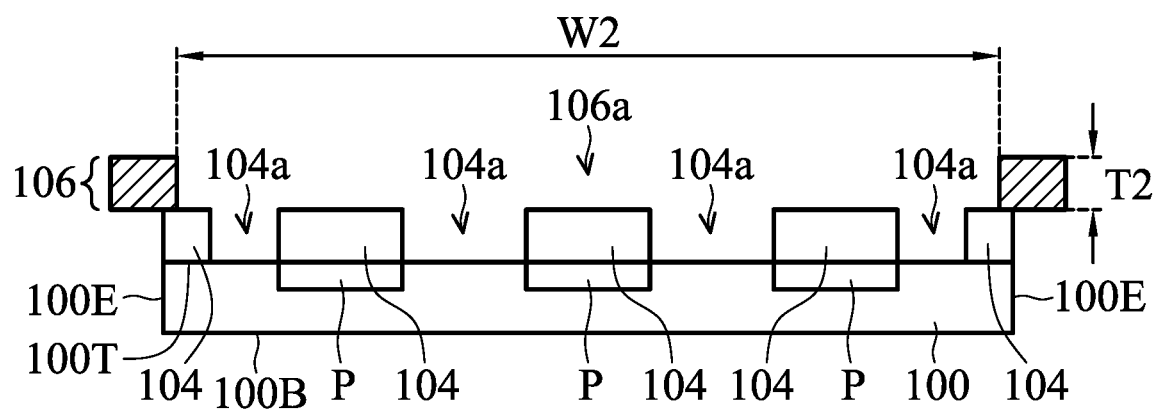
Figure 1E:
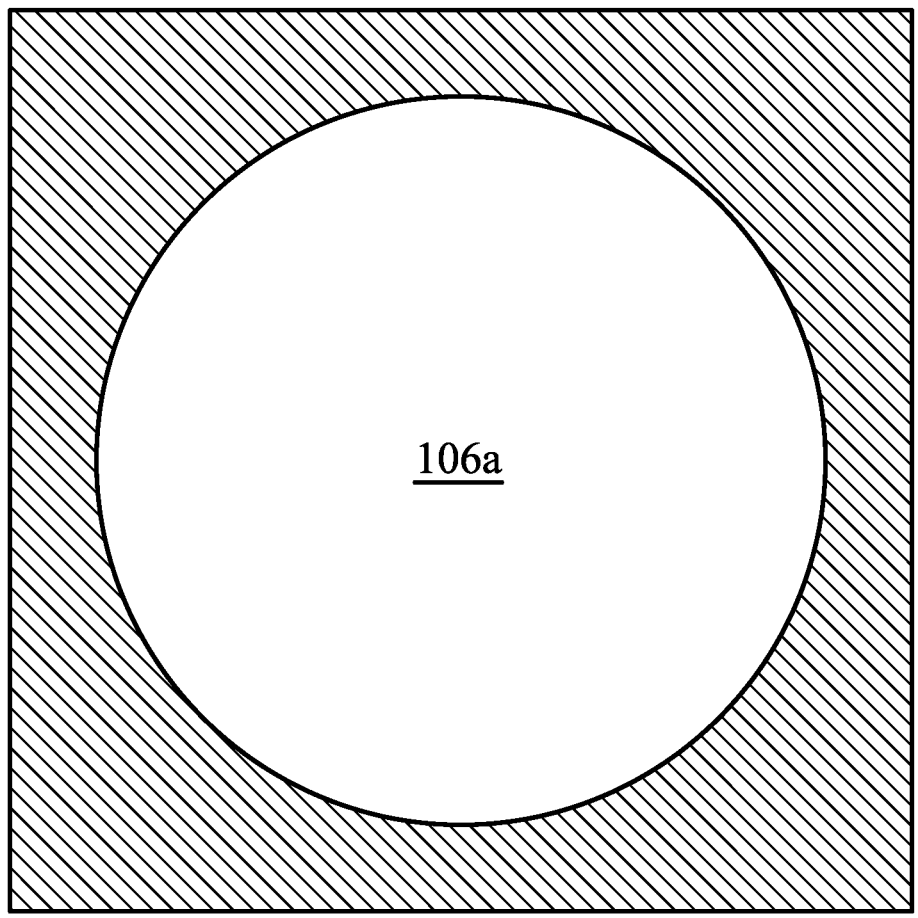

Then, as shown in FIG. 1E, a stencil 106 is placed on the top surface 100T of the substrate 100 and on the first material 104. In some embodiments, the stencil 106 may have at least one opening (e.g., an opening 106a). In some embodiments, as shown in FIG. 1E, the opening 106a of the stencil 106 exposes the top surface 100T not covered by the first material 104.

In some embodiments, as shown in FIG. 1E, the opening 106a of the stencil 106 exposes the openings 104a in the first material 104. In other words, in these embodiments, the opening 106a is in connection with the openings 104a.

As shown in FIG. 1E, the stencil 106 may have a thickness T2, and the opening 106a may have a width W2. For example, the thickness T2 may be between 10 μm and 100 μm, but the present disclosure is not limited thereto. For example, the width W2 may be between 196 μm and 300 μm, but the present disclosure is not limited thereto. In some embodiments, the ratio of the thickness T1 of the stencil 102 to the thickness T2 of the stencil 106 may be between 1 and 10.

FIG. 1E' illustrates a top view of the stencil 106. In some embodiments, as shown in FIG. 1E', the opening 106a of the stencil 106 forms an openwork pattern in the stencil 106. In some embodiments, the openwork pattern of the stencil 102 is different from the openwork pattern of the stencil 106.

In subsequent steps, a material (e.g., light-shielding material) may be disposed on the top surface 100T of the substrate 100 and on the first material 104 through the openwork pattern of the stencil 106, so that the material disposed on the top surface 100T of the substrate 100 and on the first material 104 may have a pattern that corresponds to the openwork pattern of the stencil 106. The details are discussed in the following paragraphs.

In some embodiments, the shape of the opening 106a may be substantially the same as the shape of the substrate 100. For example, in some embodiments, the substrate 100 may be round from a top view, and thus the opening 106a may also be round from the top view (as shown in FIG. 1E'). However, the present disclosure is not limited thereto. In some other embodiments, the opening 106a may be round, oval, oblong, hexagonal, irregular-shaped, another applicable shape, or a combination thereof to meet the design requirements (e.g., according to the shape of the substrate 100 used).

For example, the material of the stencil 106 and the method for forming the opening 106a may be the same as or similar to those of the stencil 102 and the openings 102a discussed above. The details will not be repeated in the interests of simplicity and clarity.

Figure 1F:
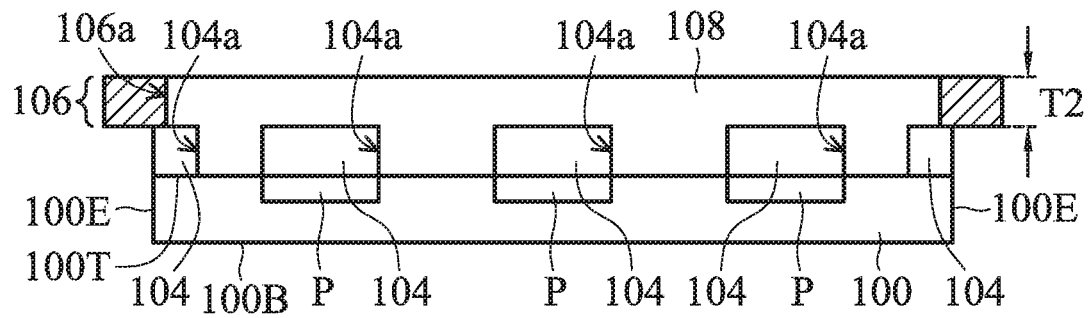

Then, as shown in FIG. 1F, in some embodiments, a second material 108 is disposed on the top surface 100T of the substrate 100 and on the first material 104 through the stencil 106. As shown in FIG. 1F, the opening 106a and the openings 104a may be filled with the second material 108. In some embodiments, the second material 108 in the openings 104a may not cover the pixels P of the substrate 100. As discussed above, since the second material 108 is disposed on the top surface 100T of the substrate 100 and on the first material 104 through the openwork pattern of the stencil 106, the second material 108 disposed on the top surface 100T of the substrate 100 and on the first material 104 may have a pattern that corresponds to the openwork pattern of the stencil 106. In some embodiments, the pattern of the second material 108 disposed on the top surface 100T of the substrate 100 and on the first material 104 may be substantially the same as the openwork pattern of the stencil 106.

In some embodiments, the first material 104 disposed on the edges of the top surface 100T of the substrate 100 may serve as a dam, and thus situations in which the second material 108 flows out of the edges of the substrate 100 may be reduced or avoided.

In some embodiments, the second material 108 may include a light-shielding material. For example, the light-shielding material may include photoresist (e.g., black photoresist or any other applicable opaque photoresist), ink (e.g., black ink or any other applicable opaque ink), molding compound (e.g., black molding compound or any other opaque molding compound), solder mask (e.g., black solder mask or any other opaque solder mask), any other applicable material, or a combination thereof. In some embodiments, the second material 108 may include a light curing material, a thermal curing material, or a combination thereof. In some embodiments, the flowability of the second material 108 may be the same as or similar to gel or glue.

In some embodiments, the stencil 106 may be used to perform a stencil printing process to coat (or print) the second material 108 onto the top surface 100T of the substrate 100. In some embodiments, in the stencil printing process, the second material 108 is disposed on the stencil 106, and then a squeegee or a roller (not shown in the figures) may be moved on the top surface of the stencil 106 along a direction that is parallel with the top surface 100T of the substrate 100. The squeegee or the roller may provide an applicable pressure on the second material 108, so that the second material 108 is squeezed into the opening 106a and the openings 104a from the top surface of the stencil 106.

Figure 1G:
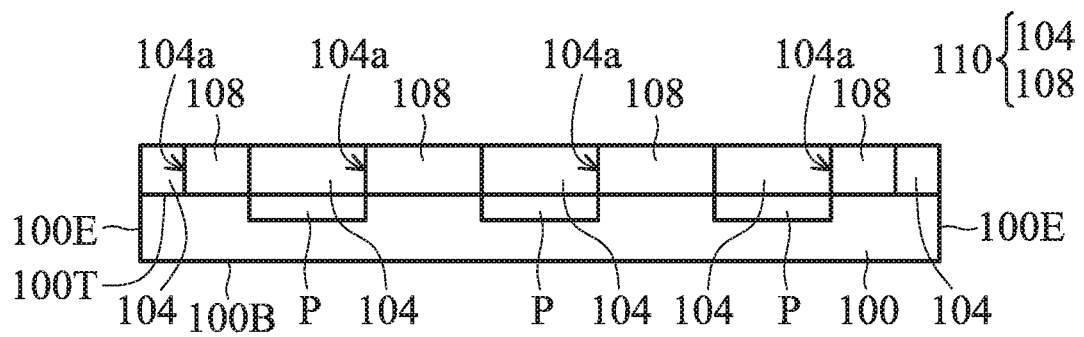

Then, as shown in FIG. 1G, the stencil 106 is removed from the top surface 100T of the substrate 100. In some embodiments, a curing process may be performed to cure the second material 108 after the stencil 106 is removed from the top surface 100T of the substrate 100. For example, the curing process may be a light curing process, a thermal curing process, or a combination thereof. In some embodiments, a planarization process may be performed to planarize the second material 108, so that the top surface of the second material 108 and the top surface of the first material 104 may be substantially on the same level. In other words, in these embodiments, the top surface of the second material 108 and the top surface of the first material 104 may be coplanar. For example, the planarization process may include a grinding process, a chemical mechanical polishing (CMP) process, an etch back process, any other applicable process, or a combination thereof.

In some embodiments, as shown in FIG. 1G, the first material 104 and the second material 108 may collectively serve as a light collimator layer 110 of a semiconductor device. In some embodiments, the first material 104 and the second material 108 of the light collimator layer 110 may be arranged staggered with each other.

In some embodiments, the second material 108 of the light collimator layer 110 is black (e.g., the second material 108 is black photoresist, black ink, black molding compound, or black solder mask), and thus the collimating function of the light collimator layer 110 may be improved.

Figure 1H:
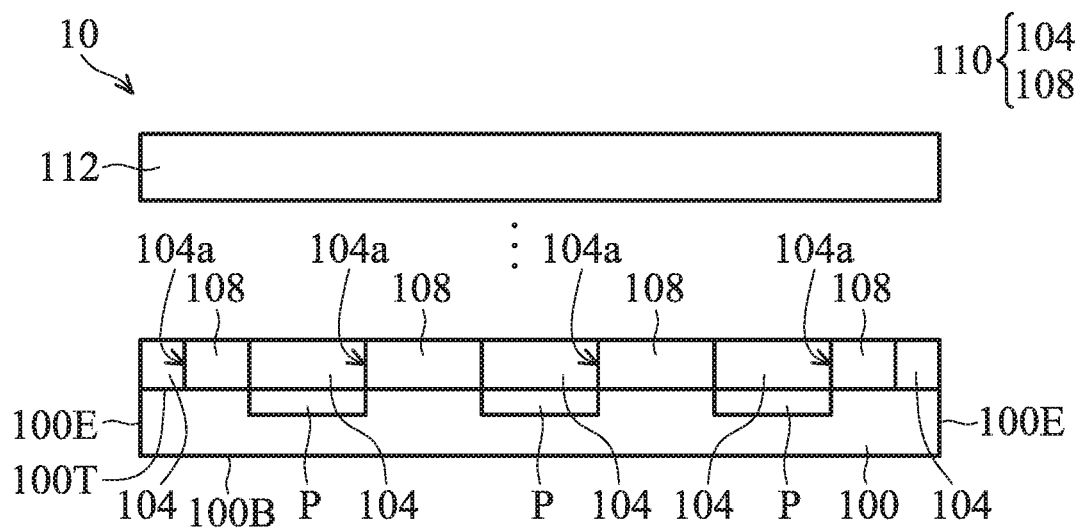

For example, in some embodiments, a light source (e.g., a light-emitting diode, not shown in the figures), a blocking layer (not shown in the figures), any other applicable optical element, or a combination thereof may be disposed on the light collimator layer 110, and a cover plate (e.g., a glass cover plate) 112 may be disposed on these optical elements, so as to form a semiconductor device 10 (e.g., a fingerprint identification device), as shown in FIG. 1H.

In some embodiments, the steps illustrated in FIGS. 1B to 1G may be repeated (e.g., they may be repeated twice, three times, or any other appropriate number of times), so that the first material 104 (which may also be referred to as a transparent pillar 104) on the pixels P of the substrate 100 may have a high aspect ratio, improving the collimating function of the light collimator layer 110. For example, as shown in FIG. 1H', in some embodiments, the aspect ratio (i.e., H1/W3) of the first material 104 (which may also be referred to as a transparent pillar 104) on the pixels P of the substrate 100 may be between 2 and 30 (e.g., between 10 and 20).

In summary, the method for forming the semiconductor device of the present embodiment uses the stencil printing process to form the light collimator layer of the semiconductor device, and thus the costs of the semiconductor device may be reduced. In addition, since the costs of the stencil printing process are low, the performance of the light collimator layer may be improved without significantly increasing the costs of the light collimator layer by repeating the stencil printing process for several times to increase the aspect ratio of the transparent material of the light collimator layer.

FIG. 1H" illustrates some variations of the semiconductor device 10 of the present embodiment. It should be noted that, unless otherwise specified, elements of the embodiments of FIG. 1H" that are the same as or similar to the elements of the above embodiments will be denoted by the same reference numerals, and the formation methods thereof may be the same as or similar to those of the above embodiments.

As shown in FIG. 1H", one difference between the semiconductor device 10' and the semiconductor device 10 is that the first material 104 of the light collimator layer 110 of the semiconductor device 10' includes a transparent material 104' and a plurality of light filtering particles 104" disposed in the transparent material 104'. In some embodiments, since the light filtering particles 104" have the function of filtering the light, no additional light filtering layer needs to be disposed between the substrate 100 and the light collimator layer 110, facilitating the miniaturization of the semiconductor device 10'. In some embodiments, the light collimator layer 110 is in direct contact with the top surface 100T of the substrate 100.

For example, the transparent material 104' may be transparent photoresist, polyimide, epoxy, another applicable material, or a combination thereof. For example, the light filtering particles 104" may be made of $TiO_2$, $HfO_2$, $NbTiO_5$, $SiO_2$, another applicable material, or a combination thereof. In some embodiments, the light filtering particles 104" may be substantially round, and the diameter thereof may be between 0.01 μm and 10 μm, but the present disclosure is not limited thereto.

In some embodiments, the light filtering particles 104" may be substantially evenly distributed in the transparent material 104'.

Embodiment 2

One difference between Embodiment 1 and Embodiment 2 is that in the method of Embodiment 2, the step of disposing the second material 108 on the substrate 100 is performed before the step of disposing the first material 104 on the substrate 100. The details are discussed in the following paragraphs.

It should be noted that, unless otherwise specified, elements of Embodiment 2 that are the same as or similar to the elements of the above embodiments will be denoted by the same reference numerals, and the formation methods thereof may be the same as or similar to those of the above embodiments.

Figure 2A:
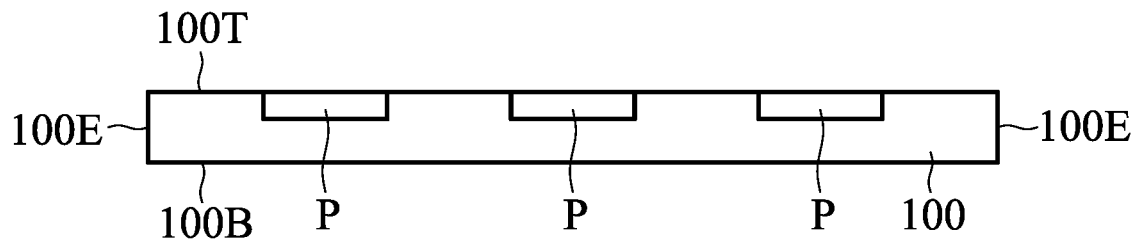
FIGS. 2A, 2B, 2C, 2D, 2E, 2F, 2G, and 2H are a series of cross-sectional views illustrating a method for forming a semiconductor device, in accordance with some embodiments of the present disclosure.
Figure 2B:
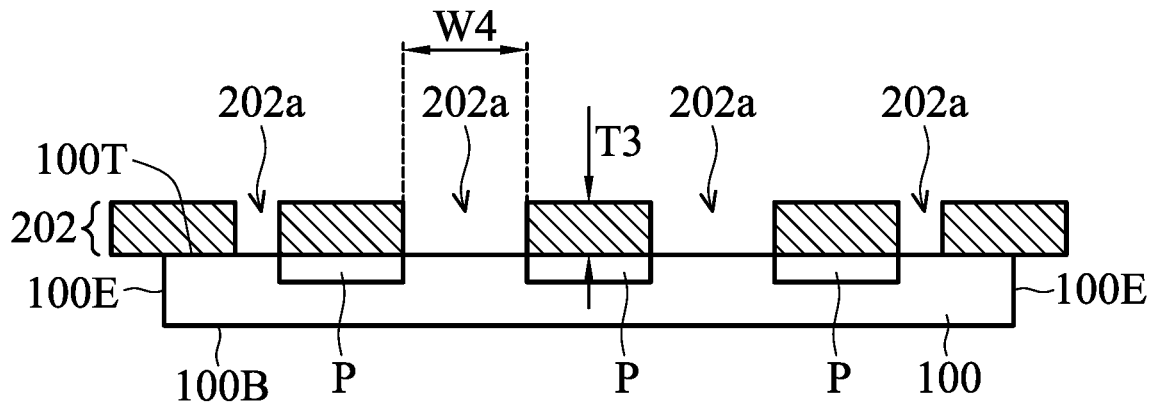

First, as shown in FIG. 2A, the substrate 100 is provided. Then, as shown in FIG. 2B, a stencil 202 is disposed on the top surface 100T of the substrate 100. In some embodiments, the stencil 202 may have a plurality of openings 202a to expose the top surface 100T of the substrate 100. In other words, in these embodiments, after the stencil 202 is placed on the top surface 100T of substrate 100, the openings 202a of the stencil 202 may expose the top surface 100T of the substrate 100. In some embodiments, as shown in FIG. 2B, the openings 202a of the stencil 202 may not expose the pixels P of the substrate 100. In some other embodiments, the openings 202a of the stencil 202 may partially expose the pixels P of the substrate 100.

As shown in FIG. 2B, the stencil 202 may have a thickness T3, the opening 202a may have a width W4. For example, the thickness T3 may be between 2 µm and 300 µm, but the present disclosure is not limited thereto. For example, the width W4 may be between 2 µm and 200 µm, but the present disclosure is not limited thereto.

Like the above embodiments, the openings 202a of the stencil 202 of the present embodiment also form an openwork pattern in the stencil 202. In subsequent steps, a material (e.g., light-shielding material) may be disposed on the top surface 100T of the substrate 100 through the openwork pattern of the stencil 202, so that the material disposed on the top surface 100T of the substrate 100 may have a pattern that corresponds to the openwork pattern of the stencil 202. The details are discussed in the following paragraphs.

In some embodiments, from a top view, the openings 202a may be substantially rectangular, but the present disclosure is not limited thereto. In some other embodiments, the openings 202a may be round, oval, oblong, hexagonal, irregular-shaped, another applicable shape, or a combination thereof to meet the design requirements.

For example, the material of the stencil 202 and the method for forming the openings 202a may be the same as or similar to those of the stencil 102 and the openings 102a discussed above. The details will not be repeated in the interests of simplicity and clarity.

Figure 2C:
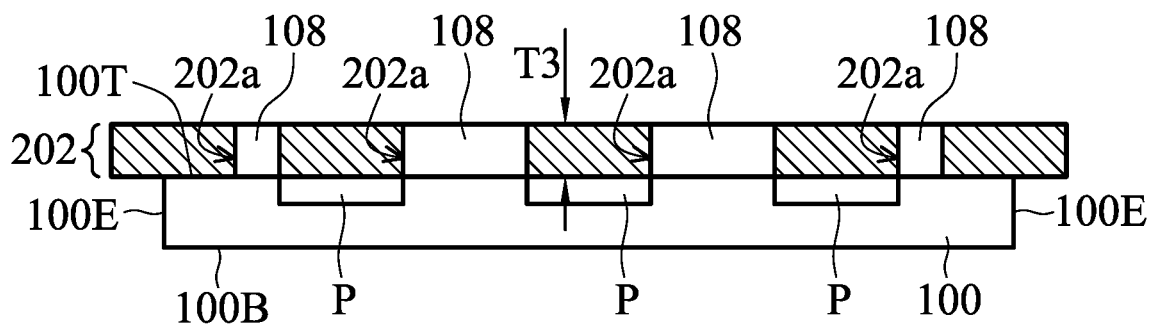

Then, as shown in FIG. 2C, in some embodiments, the second material 108 is disposed on the top surface 100T of the substrate 100 through the stencil 202. As shown in FIG. 2C, the openings 202a may be filled with the second material 108. As discussed above, since the second material 108 is disposed on the top surface 100T of the substrate 100 through the openwork pattern of the stencil 202, the second material 108 disposed on the top surface 100T of the substrate 100 may have a pattern that corresponds to the openwork pattern of the stencil 202. In some embodiments, the pattern of the second material 108 disposed on the top surface 100T of the substrate 100 may be substantially the same as the openwork pattern of the stencil 202.

In some embodiments, the stencil 202 may be used to perform a stencil printing process to coat (or print) the second material 108 onto the top surface 100T of the substrate 100. In some embodiments, in the stencil printing process, the second material 108 is disposed on the stencil 202, and then a squeegee or a roller (not shown in the figures) may be moved on the top surface of the stencil 202 along a direction that is parallel with the top surface 100T of the substrate 100. The squeegee or the roller may provide an applicable pressure on the second material 108, so that the second material 108 is squeezed into the openings 202a from the top surface of the stencil 202.

Figure 2D:
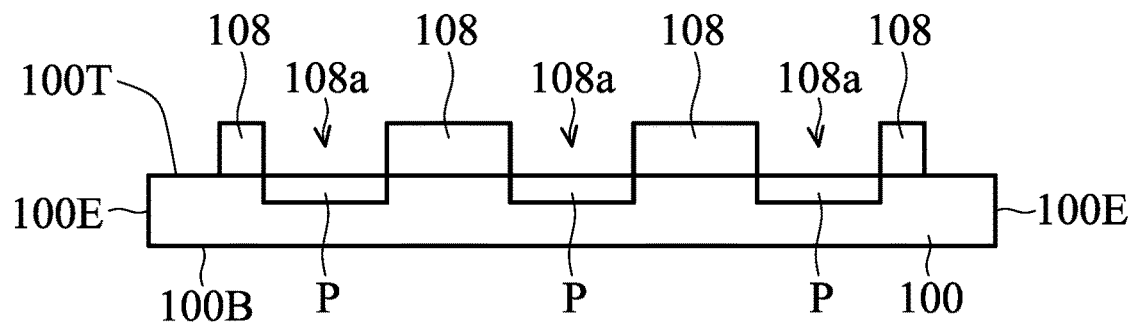

Then, as shown in FIG. 2D, the stencil 202 is removed from the top surface 100T of the substrate 100. In some embodiments, as shown in FIG. 2D, after the stencil 202 is removed from the top surface 100T of the substrate 100, a plurality of openings 108a are formed in the second material 108. In some embodiments, the openings 108a expose the pixels P of the substrate 100. In some embodiments, the second material 108 doses not cover the edges of the top surface 100T of the substrate 100. In some embodiments, a curing process may be performed to cure the second material 108 after the stencil 202 is removed from the top surface 100T of the substrate 100. For example, the curing process may be a light curing process, a thermal curing process, or a combination thereof.

Figure 2E:
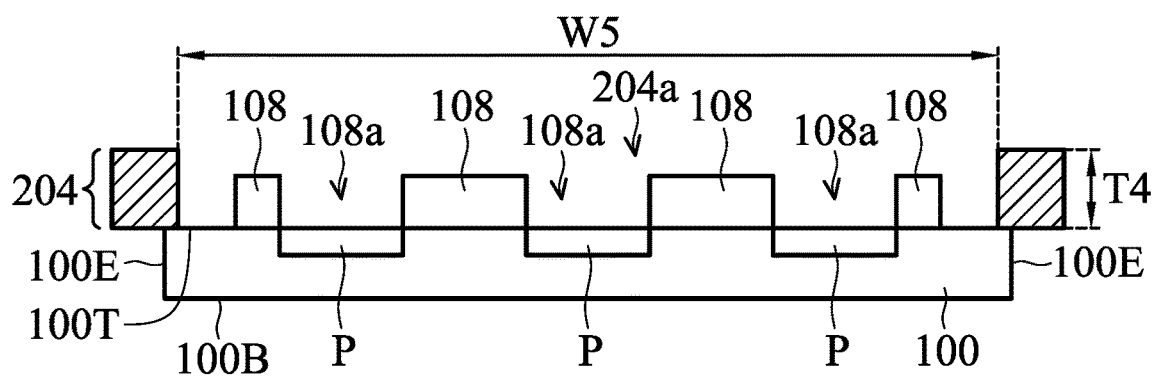

Then, as shown in FIG. 2E, a stencil 204 is placed on the top surface 100T of the substrate 100. In some embodiments, the stencil 204 may have at least one opening (e.g., an opening 204a). In some embodiments, as shown in FIG. 2E, the opening 204a of the stencil 204 exposes the pixels P of the substrate 100 and the edges of the top surface 100T of the substrate 100.

In some embodiments, as shown in FIG. 2E, the opening 204a of the stencil 204 exposes the openings 108a in the second material 108. In other words, in these embodiments, the opening 204a is in connection with the openings 108a.

As shown in FIG. 2E, the stencil 204 may have a thickness T4, and the opening 204a may have a width W5. For example, the thickness T4 may be between 5 µm and 500 µm, but the present disclosure is not limited thereto. For example, the width W5 may be between 5 µm and 100 µm, but the present disclosure is not limited thereto.

In some embodiments, the ratio of the thickness T4 of the stencil 204 to the thickness T3 of the stencil 202 may be between 5 and 500.

Like the above embodiments, the opening 204a of the stencil 204 of the present embodiment also forms an openwork pattern in the stencil 204. In some embodiments, the openwork pattern of the stencil 204 is different from the openwork pattern of the stencil 202.

In subsequent steps, a material (e.g., transparent material) may be disposed on the top surface 100T of the substrate 100 and on the second material 108 through the openwork pattern of the stencil 204, so that the material disposed on the top surface 100T of the substrate 100 and on the second material 108 may have a pattern that corresponds to the openwork pattern of the stencil 204. The details are discussed in the following paragraphs.

In some embodiments, the shape of the opening 204a may be substantially the same as the shape of the substrate 100. For example, in some embodiments, the substrate 100 may be round from a top view, and thus the opening 204a may also be round from the top view. However, the present disclosure is not limited thereto. In some other embodiments, the opening 204a may be round, oval, oblong, hexagonal, irregular-shaped, another applicable shape, or a combination thereof to meet the design requirements (e.g., according to the shape of the substrate 100 used).

For example, the material of the stencil 204 and the method for forming the opening 204a may be the same as or similar to those of the stencil 102 and the openings 102a discussed above. The details will not be repeated in the interests of simplicity and clarity.

In some embodiments, as shown in FIG. 2E, the top surface of the stencil 204 may be higher than the top surface of the second material 108, but the present disclosure is not limited thereto. In some other embodiments, the top surface of the stencil 204 may be substantially level with the top surface of the second material 108.

Figure 2F:
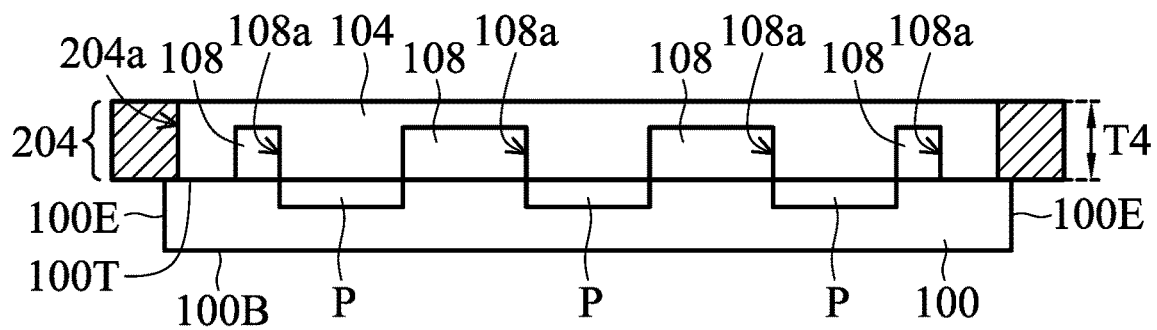

Then, as shown in FIG. 2F, in some embodiments, the first material 104 is disposed on the top surface 100T of the substrate 100 and on the second material 108 through the stencil 204. As shown in FIG. 2F, the opening 204a and the openings 108a may be filled with the first material 104. In some embodiments, the first material 104 in the openings 108a may cover the pixels P of the substrate 100. In some embodiments, the first material 104 may cover the edges of the top surface 100T of the substrate 100. As discussed above, since the first material 104 is disposed on the top surface 100T of the substrate 100 and on the second material 108 through the openwork pattern of the stencil 204, the first material 104 disposed on the top surface 100T of the substrate 100 and on the second material 108 may have a pattern that corresponds to the openwork pattern of the stencil 204. In some embodiments, the pattern of the first material 104 disposed on the top surface 100T of the substrate 100 and on the second material 108 may be substantially the same as the openwork pattern of the stencil 204.

In some embodiments, the stencil 204 may be used to perform a stencil printing process to coat (or print) the first material 104 onto the top surface 100T of the substrate 100. In some embodiments, in the stencil printing process, the first material 104 is disposed on the stencil 204, and then a squeegee or a roller (not shown in the figures) may be moved on the top surface of the stencil 204 along a direction that is parallel with the top surface 100T of the substrate 100. The squeegee or the roller may provide an applicable pressure on the first material 104, so that the first material 104 is squeezed into the opening 204a and the openings 108a from the top surface of the stencil 204.

Figure 2G:
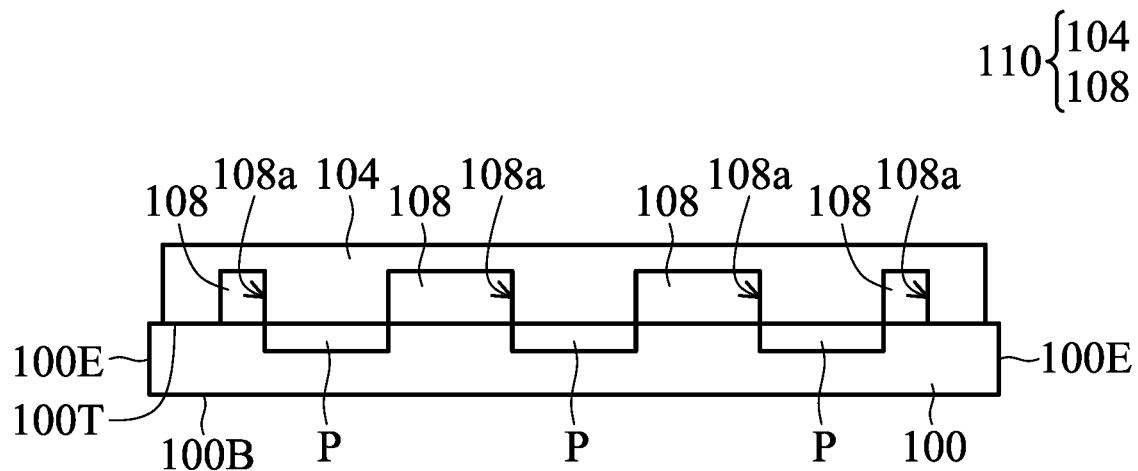

Then, as shown in FIG. 2G, the stencil 204 is removed from the top surface 100T of the substrate 100. In some embodiments, a curing process may be performed to cure the first material 104 after the stencil 204 is removed from the top surface 100T of the substrate 100. For example, the curing process may be a light curing process, a thermal curing process, or a combination thereof. In some embodiments, a planarization process may be performed to planarize the first material 104, so that the top surface of the first material 104 is substantially level with the top surface of the second material 108, but the present disclosure is not limited thereto.

In some embodiments, as shown in FIG. 2G, the first material 104 and the second material 108 may collectively serve as a light collimator layer 110 of a semiconductor device. In some embodiments, the first material 104 and the second material 108 of the light collimator layer 110 may be arranged staggered with each other.

Figure 2H:
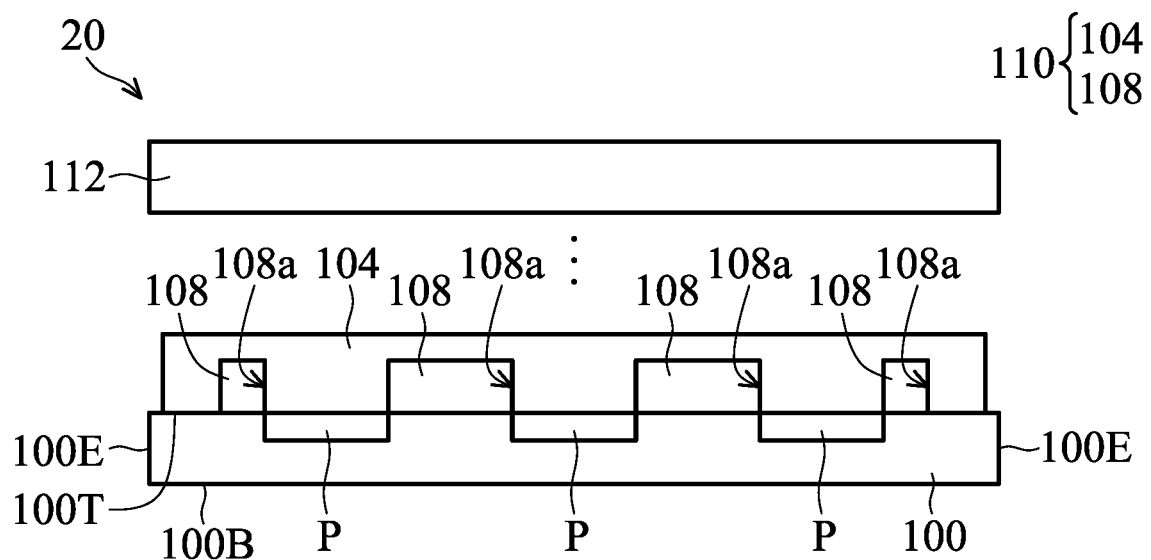
Figure 2H:
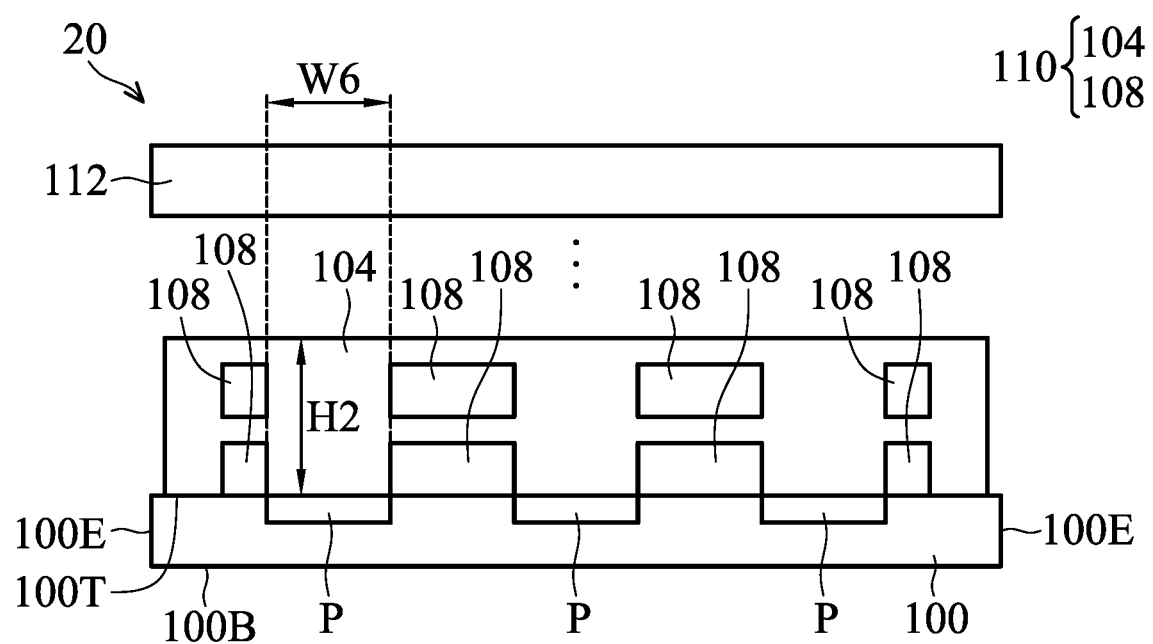

In some embodiments, a light source (e.g., a light-emitting diode, not shown in the figures), a blocking layer (not shown in the figures), any other applicable optical element, or a combination thereof may be disposed on the light collimator layer 110, and a cover plate (e.g., a glass cover plate) 112 may be disposed on these optical elements, so as to form a semiconductor device 20 (e.g., a fingerprint identification device), as shown in FIG. 2H.

In some embodiments, the steps illustrated in FIGS. 2B to 2G may be repeated (e.g., they may be repeated twice, three times, or any other appropriate number of times), so that the first material 104 (which may also be referred to as a transparent pillar 104) on the pixels P of the substrate 100 may have a high aspect ratio, improving the collimating function of the light collimator layer 110. For example, in some embodiments, the steps illustrated in FIGS. 2B to 2G may be repeated twice to form the collimator layer 110 illustrated in FIG. 2H'. In some embodiments, the aspect ratio (i.e., H2/W6) of the first material 104 (which may also be referred to as a transparent pillar 104) on the pixels P of the substrate 100 may be between 2 and 30 (e.g., between 10 and 20).

It should be understood that the first material 104 of the present embodiment may also include the transparent material 104' and the light filtering particles 104" disposed in the transparent material 104' (discussed with respect to the above embodiments), and thus the same or similar advantages may be obtained.

In summary, the method for forming the semiconductor device of the present embodiment uses the stencil printing process to form the light collimator layer of the semiconductor device, and thus the costs of the semiconductor device may be reduced. In addition, since the costs of the stencil printing process are low, the performance of the light collimator layer may be improved without significantly increasing the costs of the light collimator layer by repeating the stencil printing process for several times to increase the aspect ratio of the transparent material of the light collimator layer.

Embodiment 3

One difference between Embodiment 1 and Embodiment 3 is that the method of Embodiment 3 uses a lithography process to pattern the first material 104 which is disposed on the substrate 100 by the stencil printing process. The details are discussed in the following paragraphs.

It should be noted that, unless otherwise specified, elements of Embodiment 3 that are the same as or similar to the elements of the above embodiments will be denoted by the same reference numerals, and the formation methods thereof may be the same as or similar to those of the above embodiments.

Figure 3A:
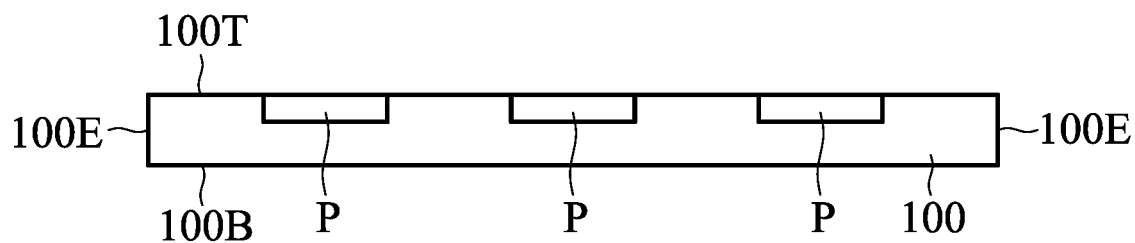
FIGS. 3A, 3B, 3C, 3D, 3E, 3F, and 3G are a series of cross-sectional views illustrating a method for forming a semiconductor device, in accordance with some embodiments of the present disclosure.
Figure 3B:
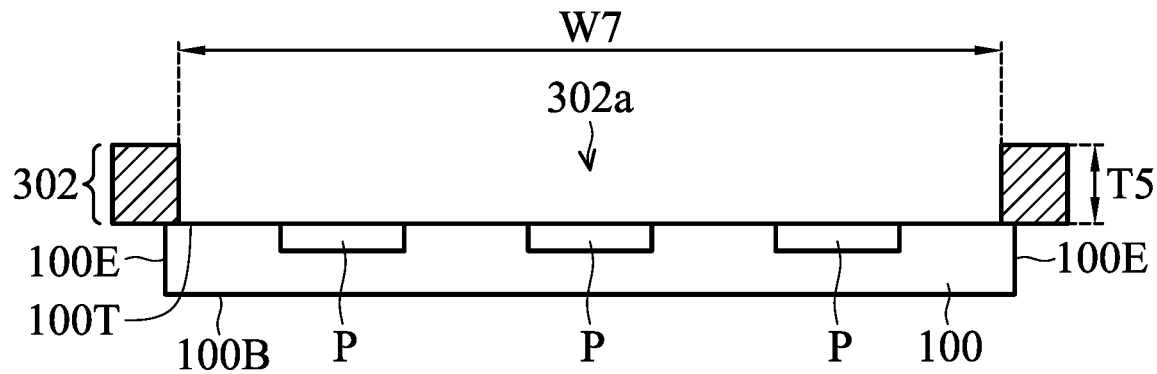

First, as shown in FIG. 3A, the substrate 100 is provided. Then, as shown in FIG. 3B, a stencil 302 is disposed on the top surface 100T of the substrate 100. In some embodiments, the stencil 302 may have at least one opening (e.g., an opening 302a). In some embodiments, as shown in FIG. 3B, the opening 302a of the stencil 302 exposes the top surface 100T of the substrate 100.

As shown in FIG. 3B, the stencil 302 may have a thickness T5, and the opening 302a may have a width W7. For example, the thickness T5 may be between 5 μm and 500 μm, but the present disclosure is not limited thereto. For example, the width W7 may be between 5 μm and 200 μm, but the present disclosure is not limited thereto.

Like the above embodiments, the opening 302a of the stencil 302 of the present embodiment also forms an openwork pattern in the stencil 302. In subsequent steps, a material (e.g., transparent photoresist) may be disposed on the top surface 100T of the substrate 100 through the openwork pattern of the stencil 302, so that the material disposed on the top surface 100T of the substrate 100 may have a pattern that corresponds to the openwork pattern of the stencil 302. The details are discussed in the following paragraphs.

In some embodiments, the shape of the opening 302a may be substantially the same as the shape of the substrate 100. For example, in some embodiments, the substrate 100 may be round from a top view, and thus the opening 302a may also be round from the top view. However, the present disclosure is not limited thereto. In some other embodiments, the opening 302a may be round, oval, oblong, hexagonal, irregular-shaped, another applicable shape, or a combination thereof to meet the design requirements (e.g., according to the shape of the substrate 100 used).

For example, the material of the stencil 302 and the method for forming the opening 302*a* may be the same as or similar to those of the stencil 102 and the openings 102*a* discussed above. The details will not be repeated in the interests of simplicity and clarity.

Figure 3C:
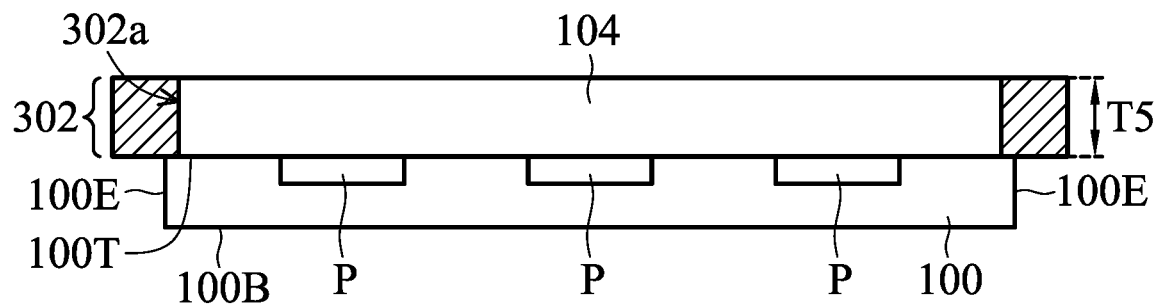

Then, as shown in FIG. 3C, in some embodiments, the first material 104 is disposed on the top surface 100T of the substrate 100 through the stencil 302. In some embodiments, the stencil 302 may be used to perform a stencil printing process to coat (or print) the first material 104 onto the top surface 100T of the substrate 100. As shown in FIG. 3C, the first material 104 may fill the opening 302*a* and cover the pixels P of the substrate 100. As discussed above, since the first material 104 is disposed on the top surface 100T of the substrate 100 through the openwork pattern of the stencil 302, the first material 104 disposed on the top surface 100T of the substrate 100 may have a pattern that corresponds to the openwork pattern of the stencil 302. In some embodiments, the pattern of the first material 104 disposed on the top surface 100T of the substrate 100 may be substantially the same as the openwork pattern of the stencil 302.

Figure 3D:
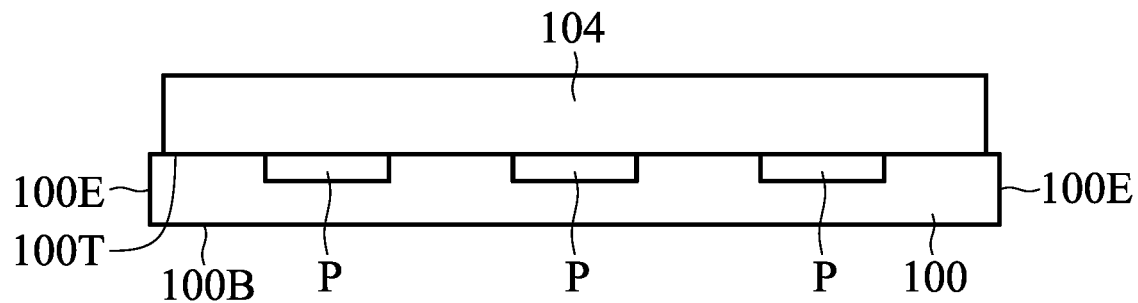

Then, as shown in FIG. 3D, the stencil 302 is removed from the top surface 100T of the substrate 100. In some embodiments, a curing process may be performed to cure the first material 104 after the stencil 302 is removed from the top surface 100T of the substrate 100. For example, the curing process may be a light curing process, a thermal curing process, or a combination thereof.

Figure 3E:
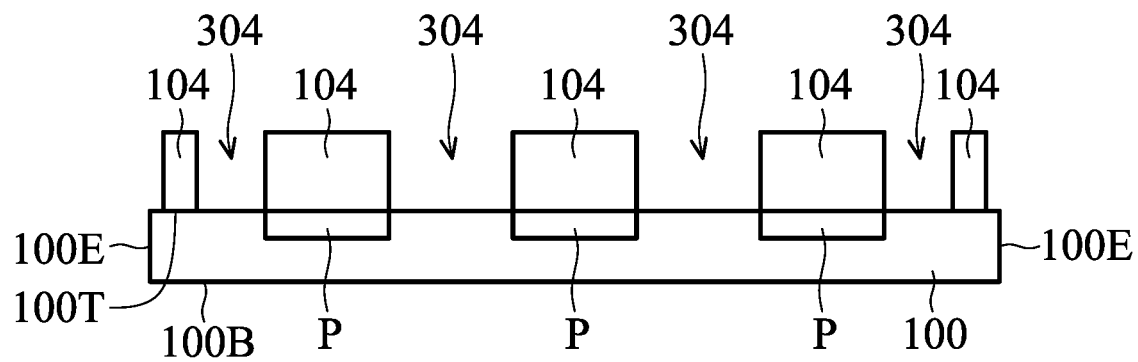

Then, as shown in FIG. 3E, a patterning process is performed to pattern the first material 104, so as to form a plurality of openings 304 in the first material 104. In some embodiments, the patterning process may include a lithography process (e.g., mask aligning, exposure, post-exposure baking, developing photoresist, any other applicable process, or a combination thereof). In some embodiments, as shown in FIG. 3E, after the patterning process, the first material 104 still covers the pixels P of the substrate 100. In some embodiments, after the patterning process, the first material 104 is still disposed on the edges of the top surface 100T of the substrate 100.

Figure 3F:
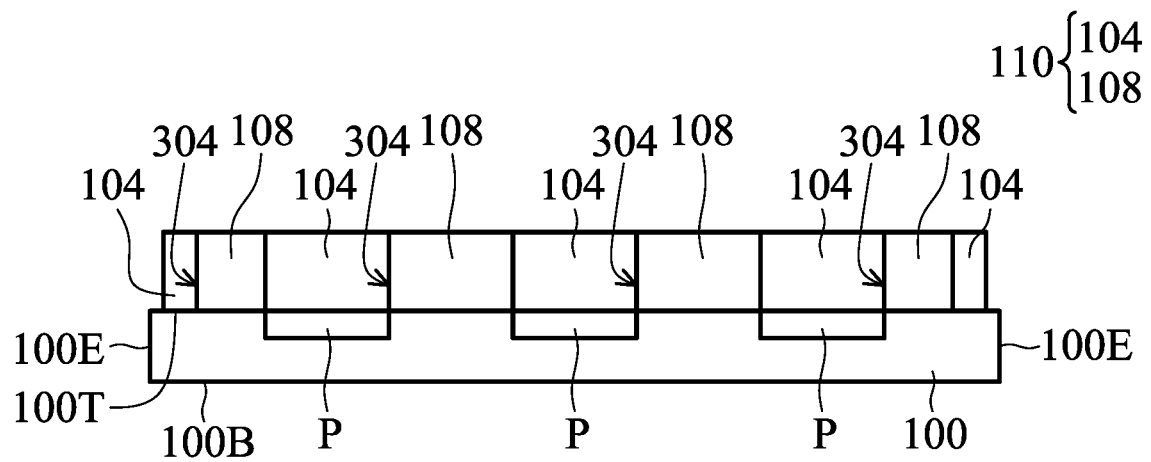

Then, as shown in FIG. 3F, the openings 304 are filled with the second material 108. For example, a stencil printing process, a spin-on coating process, another applicable process, or a combination thereof may be used to dispose the second material 108 in the openings 304. In some embodiments, since the first material 104 is disposed on the edges of the top surface 100T of the substrate 100, the situation in which the second material 108 flows out from the edges of the substrate 100 may be reduced or avoided.

In some embodiments, as shown in FIG. 3F, the first material 104 and the second material 108 may collectively serve as a light collimator layer 110 of a semiconductor device. In some embodiments, the first material 104 and the second material 108 of the light collimator layer 110 may be arranged staggered with each other.

Figure 3G:
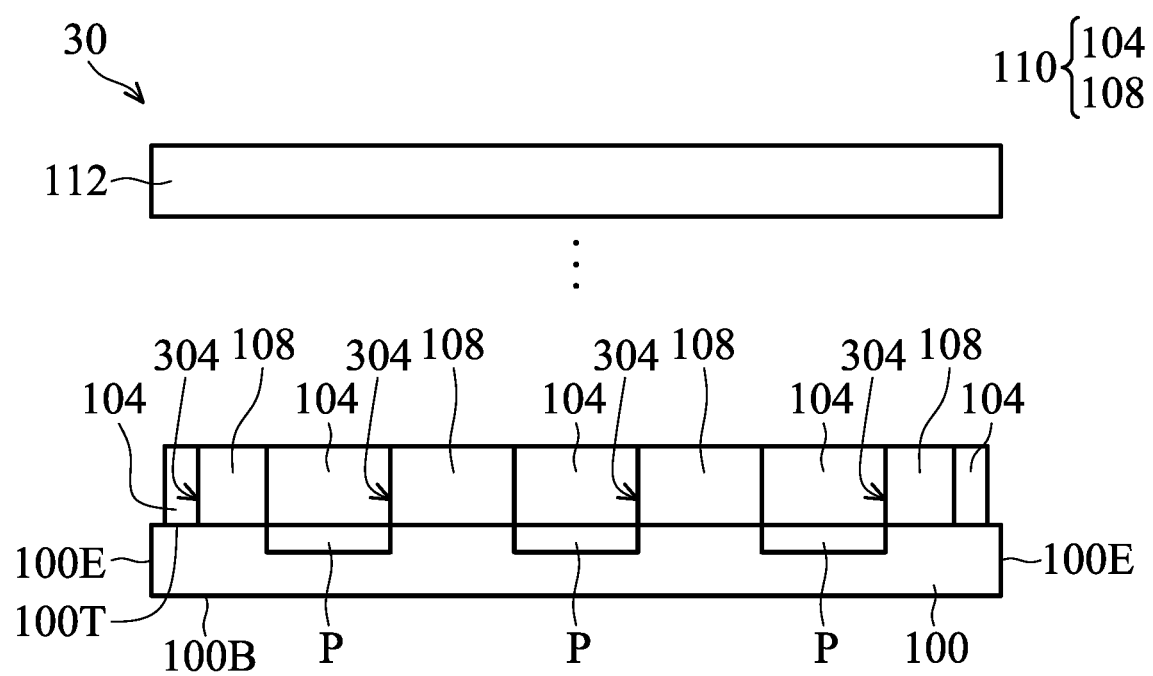

In some embodiments, a light source (e.g., a light-emitting diode, not shown in the figures), a blocking layer (not shown in the figures), any other applicable optical element, or a combination thereof may be disposed on the light collimator layer 110, and a cover plate (e.g., a glass cover plate) 112 may be disposed on these optical elements, so as to form a semiconductor device 30 (e.g., a fingerprint identification device), as shown in FIG. 3G.

In some embodiments, the steps illustrated in FIGS. 3B to 3F may be repeated (e.g., they may be repeated twice, three times, or any other appropriate number of times), so that the first material 104 (which may also be referred to as a transparent pillar 104) on the pixels P of the substrate 100 may have a high aspect ratio, improving the collimating function of the light collimator layer 110. In some embodiments, the aspect ratio of the first material 104 (which may also be referred to as a transparent pillar 104) on the pixels P of the substrate 100 may be between 2 and 30 (e.g., between 10 and 20).

It should be understood that the first material 104 of the present embodiment may also include the transparent material 104' and the light filtering particles 104" disposed in the transparent material 104' (discussed with respect to the above embodiments), and thus the same or similar advantages may be obtained.

In summary, the method for forming the semiconductor device of the present embodiment uses a stencil printing process and a lithography process to form a light collimator layer of the semiconductor device, and thus the cost of the semiconductor device may be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Furthermore, each claim may be an individual embodiment of the present disclosure, and the scope of the present disclosure includes the combinations of every claim and every embodiment of the present disclosure.

What is claimed is:

1. A semiconductor device, comprising:
a semiconductor substrate;
a light collimator layer disposed on the semiconductor substrate, wherein the light collimator layer comprises:
a transparent material and a light-shielding material, wherein the transparent material is disposed correspondingly only to a pixel within the semiconductor substrate; and
a plurality of light filtering particles disposed in the transparent material, wherein the light filtering particles are made of a light filtering material, wherein the light filtering particles are evenly distributed across a thickness of the transparent material.

2. The semiconductor device of claim 1, wherein the transparent material is in direct contact with the semiconductor substrate.

3. The semiconductor device of claim 1, wherein the transparent material comprises a light curing material, a thermal curing material, or a combination thereof.

4. The semiconductor device of claim 1, wherein a portion of the transparent material is disposed on edges of the semiconductor substrate.

5. The semiconductor device of claim 1, further comprising a cover plate disposed on the light collimator layer.

6. A fingerprint identification device, comprising:
a semiconductor substrate; and
a light collimator layer disposed on the semiconductor substrate, wherein the light collimator layer comprises:

a transparent material and a light-shielding material, wherein the transparent material is disposed correspondingly only to a pixel within the semiconductor substrate; and a plurality of light filtering particles disposed in the transparent material, wherein the light filtering particles are made of a light filtering material, wherein the light filtering particles are evenly distributed across a thickness of the transparent material.

7. The fingerprint identification device of claim 6, wherein the transparent material is in direct contact with the semiconductor substrate.

8. The fingerprint identification device of claim 6, wherein the transparent material comprises a light curing material, a thermal curing material, or a combination thereof.

9. The fingerprint identification device of claim 6, wherein a portion of the transparent material is disposed on edges of the semiconductor substrate.

10. The fingerprint identification device of claim 6, further comprising a cover plate disposed on the light collimator layer.

\* \* \* \* \*